United States Patent
Chou et al.

(10) Patent No.: US 7,282,456 B2
(45) Date of Patent: Oct. 16, 2007

(54) SELF-REPAIR AND ENHANCEMENT OF NANOSTRUCTURES BY LIQUIFICATION UNDER GUIDING CONDITIONS

(75) Inventors: Stephen Y. Chou, Princeton, NJ (US); Qiangfei Xia, Princeton, NJ (US)

(73) Assignee: Princeton University, Princeton, NJ (US)

( * ) Notice: Subject to any disclaimer, the term of this patent is extended or adjusted under 35 U.S.C. 154(b) by 0 days.

(21) Appl. No.: 11/442,900

(22) Filed: May 29, 2006

(65) Prior Publication Data
US 2007/0026686 A1    Feb. 1, 2007

Related U.S. Application Data (60) Provisional application No. 60/685,940, filed on May 31, 2005, provisional application No. 60/685,277, filed on May 27, 2005.

(51) Int. Cl.
*H01L 21/477* (2006.01)

(52) U.S. Cl. ............... 438/760; 438/799; 977/888

(58) Field of Classification Search ............ 977/887, 977/888, 900
See application file for complete search history.

(56) References Cited

U.S. PATENT DOCUMENTS

| | | | |
|---|---|---|---|
| 5,772,905 A * | 6/1998 | Chou | 216/44 |
| 6,755,984 B2 * | 6/2004 | Lee et al. | 216/54 |
| 2004/0087186 A1 * | 5/2004 | Brask | 438/798 |
| 2004/0192041 A1 * | 9/2004 | Jeong et al. | 438/689 |
| 2005/0269745 A1 * | 12/2005 | Cherala et al. | 264/320 |

OTHER PUBLICATIONS

International Search Report and Written Opinion PCT/US06/20686, May 29, 2006.

* cited by examiner

*Primary Examiner*—Stephen W. Smoot
(74) *Attorney, Agent, or Firm*—Polster, Lieder, Woodruff & Lucchesi, LC (57) ABSTRACT

In accordance with the invention, the structure of a patterned nanoscale or near nanoscale device ("nanostructure") is repaired and/or enhanced by liquifying the patterned device in the presence of appropriate guiding conditions for a period of time and then permitting the device to solidify. Advantageous guiding conditions include adjacent spaced apart or contacting surfaces to control surface structure and preserve vertically. Unconstrained boundaries to permit smoothing of edge roughness. In an advantageous embodiment, a flat planar surface is disposed overlying a patterned nanostructure surface and the surface is liquified by a high intensity light source to repair or enhance the nanoscale features.

45 Claims, 6 Drawing Sheets

FIG. 3B (c) THE GUIDING STRUCTURE OVER INDIVIDUAL STRUCTRE TO BE REPAIRED HAS DIFFERENT LATERAL GEOMETRY (e.g. THE STRUCTURE FEATURE IS SQUARE BUT THE GUIDING IS TRIANGLE)

THE 70 nm WIDE AND 100 nm THICK Si GRATINGS ON SOI, BEFORE (a) AND (b) AFTER SELF. THE SEVER ZIG-ZAG EDGES BECOME STRAIGHT AND SMOOTH AFTER SELF.

FIG. 6

(a) 75 nm Cr SQUARES OF 10 nm THICK ON SiO2, AND (b)
AFTER SELF Cr SPACE BECOME 50 nm DIAMETER DOTS.
NOTE THE DOT DIAMETERCAN BE CONTROLLED BY CONTROLLING MELTING.

FIG. 7

SQUARE Si DOTS (LEFT) ON $SiO_2$ BECAME ROUND (RIGHT)
(SINGLE PULSE, 560 mJ/cm$^2$)

STARTING FROM A 50 nm Si/380 nm $SiO_2$ SIMOX SOI WAFER.
LASER FLUENCE FROM 450 TO 890 mJ/cm$^2$ ALL RESULT IN SIMILAR RESULT
WITHOUT NOTICEABLE ABLATION FROM THE SILICON LAYER.

SELF-REPAIR AND ENHANCEMENT OF NANOSTRUCTURES BY LIQUIFICATION UNDER GUIDING CONDITIONS

CROSS-REFERENCE TO RELATED APPLICATIONS

The present application is related to and claims priority from U.S. Provisional Patent Application Ser. No. 60/685,277 filed on May 27, 2005, and U.S. Provisional Patent Application Ser. No. 60/685,940 filed on May 31, 2005 which are herein incorporated by reference.

STATEMENT REGARDING FEDERALLY SPONSORED RESEARCH

This invention was from work supported in part by federal grants from DARPA (No. N66001-05-1-8906) and ONR (No. N00014-02-1-0916). The government has certain rights to this invention.

FIELD OF THE INVENTION

This invention relates to the fabrication of very small devices having structural features with minimum dimensions near or within the nanoscale range (less than about one micrometer). In particular, it concerns such devices with structural enhancements and reduced defects, a method for fabricating such devices and a machine for practicing the method.

BACKGROUND OF THE INVENTION

Nanoscale and near nanoscale devices are important for a wide variety of applications. They include increasingly high density semiconductor integrated circuits and a wide variety of electronic, optical, magnetic, mechanical and biological devices.

The performance of such nanoscale devices typically depends on the shapes and dimensions of their structures, and they are typically designed with precise shapes and dimensions to perform a desired function. They are fabricated by one of a variety of techniques such as lithography, etching, material deposition and imprinting. However, these fabrication techniques are not precise at the nanoscale level. They have intrinsic defects due to the statistical nature of each processes and extrinsic defects due to fabrication environment (such as dust particles). As a consequence, the devices often deviate from the desired design due to geometrical (topological) defects, structural defects or both. Typical geometrical defects include edge roughness, deviation from straight or circular edges, deviation from planarity and sidewalls that are not vertical. Typical structural defects include crystal defects, grain boundaries and material property deterioration. As the size of the devices becomes smaller, these defects increasingly degrade device performance.

Figure 9:
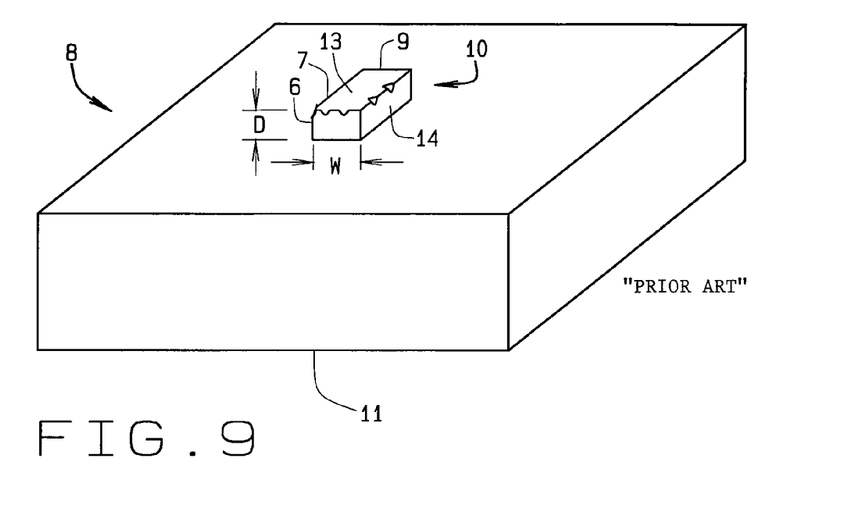
FIG. 9 illustrates a conventional nanoscale device with exaggerated nanostructure defects.

FIG. 9, which is useful in understanding problems to which the invention is directed, schematically illustrates a conventional nanoscale device with exaggerated edge roughness, deviation from planarity and deviation from verticality. The nanoscale device 8 typically comprises a macroscale substrate 11 supporting one or more nanostructures 10 which can protrude from the substrate. The nanostructure 10 typically includes an exposed "top" surface 13 distal to the substrate interface and one or more exposed lateral surfaces 14 that extend from the substrate surface to the top surface 13, intersecting the top surface at one or more edges 9. To be considered nanoscale or near nanoscale, the nanostructure 10 should have a minimum feature, such as width W, that is less than about one micrometer and, more commonly, less than about 200 nanometers.

It is usually intended for optimal performance that the exposed distal top surface 13 be smooth and parallel to the substrate. The exposed lateral surfaces 14 should be ideally vertical to the surface 13. They should be substantially free of non-vertical portions 6, and the edges 9 should be smoothly straight or, if curvature is desired, smoothly curved. The edges should be substantially free of rough, irregular features 7. In many applications, the nanostructure ideally has a high aspect ratio as measured by the ratio D/W where W is the minimum lateral dimension and the height D of the sidewall.

One approach to reducing edge roughness is to fabricate the device 8 with a polymeric resist mask that has been heated to the flowing temperature of the resist. This heating and the resulting flowing typically smoothes the edges of the resist. However, the same heating and flowing can round the edges causing them to deviate from verticality and round the surfaces from planarity. To avoid severe deviation of the vertical sidewalls and rounding of the surfaces, the duration of heating to remove edge roughness is typically very short. Consequently only part of the edge roughness is removed. As a result, the resist sidewalls and surfaces are often deformed.

To overcome the degradation of the resist structure sidewalls and surfaces, U.S. Pat. No. 6,905,949 to Artia suggests coating the entire patterned resist structure with a second material whose flowing temperature is higher than the resist and then heating to the thus-coated resist to flowing temperature. The problem with this approach, however, is that the coating encasing the resist at all interfaces makes it difficult for the resist to change shape.

It should also be noted that masking by resist is typically an early step among the many required to form a nanoscale device in a hard, high melting temperature material such as semiconductor, metal or dielectric, or mixture of them. The previous methods that blankly heat entire devices for smoothing a resist feature cannot be applied to the hard, high melting temperature materials, since the heating will melt and destroy the substrate and other surrounding structures. Consequently, even a completely smooth resist mask cannot prevent subsequent processing steps from creating new defects. Accordingly, there is a need for improved methods for repairing and enhancing the structural features of nanoscale devices.

SUMMARY OF THE INVENTION

In accordance with the invention, the structure of a patterned nanoscale or near nanoscale device (i.e. a device including nanoscale structures having a minimum lateral dimension of less than about 1 micrometer) is repaired and/or enhanced by liquifying the patterned nanostructures in the presence of appropriate guiding conditions provided by additional guiding structures for a period of time and then permitting the nanostructures to solidify. Advantageous guiding conditions include adjacent spaced or contacting guiding surfaces to control exposed nanostructure surfaces and to preserve the flatness of top surface and vertically of the sidewall. Unconstrained exposed lateral surface boundaries permit smoothing of edge roughness and curvature. In an advantageous embodiment, a guiding structure of a layer or plate having a flat planar surface is placed overlying a patterned nanostructure top surface with the flat surface either adjacent with a gap to the top surface, or in contact with the top surface. The lateral surfaces are left unconstrained and the nanostructure is liquified as by high intensity light, to repair and/or enhance the nanoscale features.

BRIEF DESCRIPTION OF DRAWINGS

The advantages, nature and various features of the invention will appear more fully upon consideration of the illustrative embodiments now to be described in detail in connection with the accompanying drawings. In the drawings:

FIG. 10.a shows an SEM image of the Cr pads (nanostructure to be repaired and enhanced) deposited on fused silica substrate with an lateral dimension of 110 nm by 140 nm and 20 nm in height.

FIG. 10.b shows an SEM image of the Cr square structure in FIG. 10.a become round dots of 80 nm diameter and 48 nm height, after subjected to a single pulse (20 ns pulse width) Excimer laser (308 nm wavelength) radiation at 420 mJ/cm2 without using any guiding structure.

FIG. 10.c shows an SEM image of the Cr square structure in FIG. 10.a become cylindrical pillars of 62 nm height with a diameter of 70 nm, which have flat tops, vertical walls, and a much higher aspect ratio, after a single laser pulse 9308 nm (wavelength) of 420 mJ/cm2 and 20 nm pulsewidth with a guiding structure made of quartz with a flat guiding surface and an initial 60 nm gap above the initial Cr structure surface. The Cr structure raised and touched the top surface during the melting.

It is to be understood that the drawings are to illustrate the concepts of the invention and are not to scale. The same reference numerals are use to designate similar components throughout the drawings.

DESCRIPTION OF THE PREFERRED EMBODIMENT

Rather than painstakingly and often hopelessly attempting to eliminate the defects in conventional fabrication, the invention repairs and enhances the structural features of a device comprising a solid nanostructure by liquifying the nanostructure for a period of time in the presence of appropriate guiding conditions provided by a guiding structure before returning the nanostructure to solid. The surface tension and low viscosity of the liquid can self-repair geometric defects. The movement of atoms and electrons in the liquid can self-repair (anneal) structure defects. The presence of guiding surfaces of a guiding structure with a gap adjacent to the top surface of the structure feature of the nanodevices can lead to the rise of the structure feature height, the narrowing of the structural feature width, and hence increase the structural feature aspect ratio. And the presence of guiding surfaces of a guiding structure with a gap adjacent or in direct contact to the top surface of the structure feature of the nanodevices can enhance the verticality of sidewalls and maintain the flatness of the structural feature top surface.

The methods of liquifying the solid into a liquid include radiation heating, as from laser beam or a lamp heating, and ultrasonic heating. The heating can be pulse or continuous. The heating also can be flooded over an entire wafer or selectively directed onto each nanostructure. Selective heating of the nanostructure can be achieved by use of heating radiation wavelengths selectively absorbed by the nanostructure material, by use of a mask to heat selected nanostrutures, or by selectively scanning a focused heating beam over selected nanostructures.

Referring to the drawings, FIGS. 1a through 1f illustrate an advantageous embodiment of the invention wherein one or more nanostructures 10a and 10b on a substrate 11 are repaired and enhanced by liquifying the nanostructures 10a and 10b in the presence of a guiding structure of a plate or layer provided to create a guiding surface 12 adjacent with a gap to the exposed nanostructure top surfaces 13a, 13b.

Figure 1:
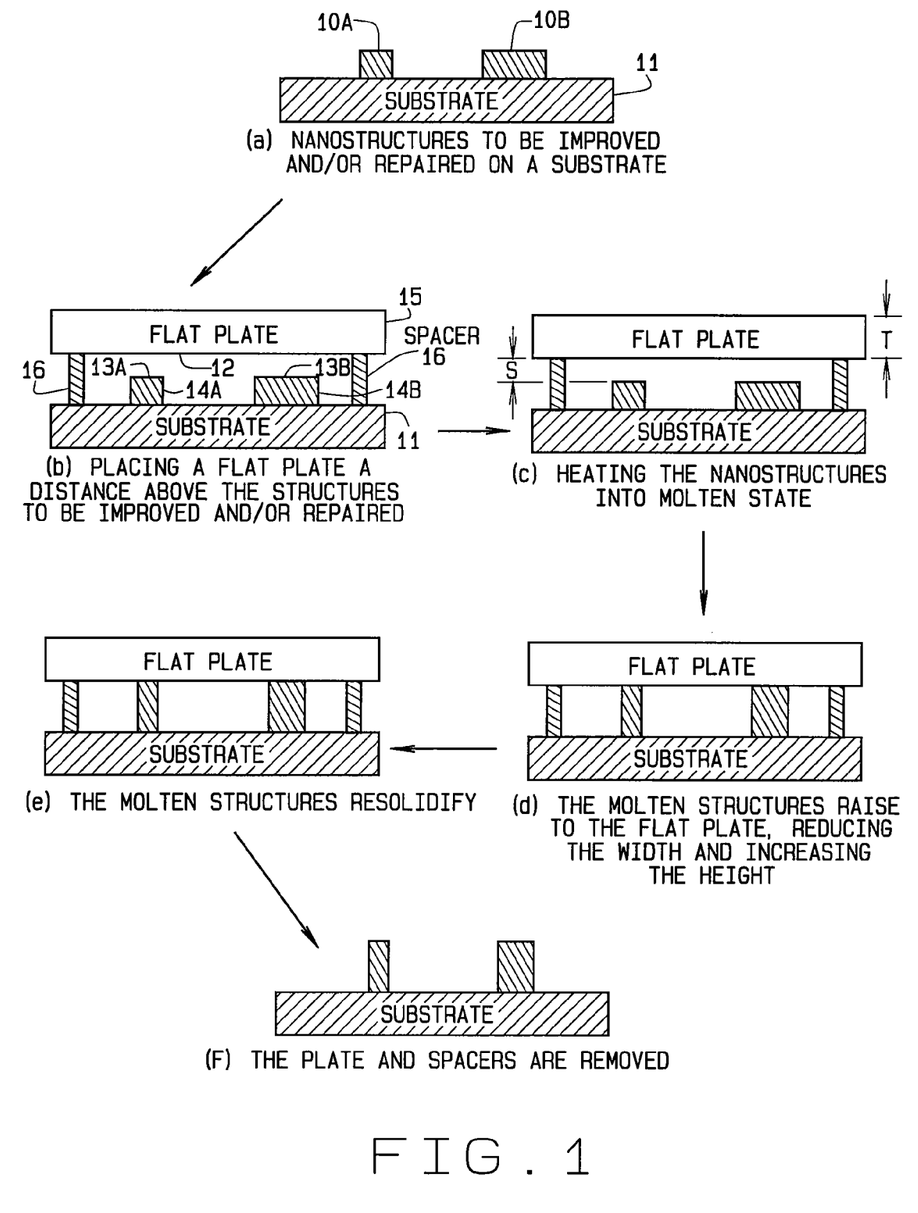
FIGS. 1a through 1f illustrate a first embodiment of the invention using a spaced guiding surface adjacent nanostructure surfaces.
Figure 2:
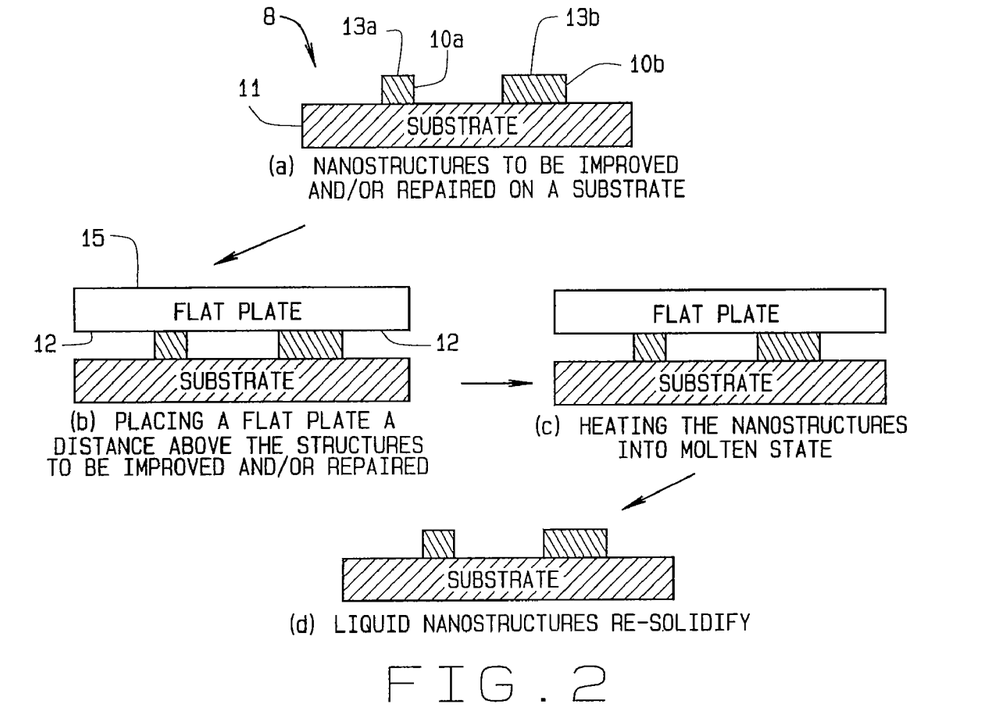
FIGS. 2a through 2d show an alternative embodiment using a guiding surface in contact with nanostructure surfaces.

The first step is to provide the nanostructure. The nanostructure can be provided by lithography, imprinting, etching or deposition. The next step is to provide the nanostructure with the appropriate guiding conditions through a additional guiding structure. As shown in FIG. 1b, the guiding surface 12 can be a flat surface of a layer or plate 15 placed with a gap adjacent surfaces 13a and 13b. Sometimes, the gap is provided and maintained by spacers 16. The spacing S can be chosen to attract material from the surfaces 13a, 13b to the guiding surface. Typical guiding layer or plate thicknesses are determined by the fabrication method. They can be a thin film with a thickness from 10 nm to 100 micron, or a plate with a thickness in the order of millimeter or so. The spacers 16 are sufficiently removed from the lateral surfaces 14a 14b that the lateral surfaces are not attracted to the spacers and are substantially free of constraint.

The third step is to liquefy the nanostructures in the presence of the guiding conditions provided by the guiding structure. FIG. 1c shows the nanostructures 10a and 10b heated to molten state for a period of time while the plate 15 and spacers 16 remain solid. The duration can be as short as 1 ps and as long as many seconds or even minutes. While in the molten state, the structures 10a and 10b advantageously rise to the flat surface 12, diminishing the nanostructures in width W while increasing their height D (FIG. 1D). This increases the aspect ratio of the nanostructures (D/W). Previously, a flat polymer film was found to raise to a guiding surface placed a distance from the film, as described in U.S. Pat. No. 6,713,238 issued to applicant Chou, et al. on Mar. 30, 2004, which is incorporated herein by reference.

The next step is to permit the nanostructures to resolidify. When the heat is removed, the nanostructures resolidify with reduced lateral edge roughness, flat top surface, and higher aspect ratio corresponding to their increased height and reduced width (FIG. 1e). The guiding structure can then optionally be removed yielding a nanostructure device with repaired and enhanced nanostructures shown in FIG. 1f. The removal can be effected by mechanical separation or solvent dissolution. In some cases, the guiding structure can be a part of functional materials of the nanodevices.

In addition to improving the aspect ratio, the plate surface 12 also keeps the nanostructure top surfaces 13 flat and helps make the nanostructure lateral surfaces 14 perpendicular ("vertical") to the top surfaces. In the liquid state, the geometrical and/or structural defects of the nanostructure are repaired and the nanostructure is enhanced by liquid flow and migration of atoms. Edge roughness decreases and rough curves become smooth curves. Crystal defects, grain boundaries and material property deterioration diminish.

FIGS. 2a through 2d illustrate an alternative embodiment wherein a guiding surface 12 is in contact with top surfaces 13a and 13b of the respective nanostructures 10a and 10b before the nanostructures are heated to the molten state. After a period of time (during which the layer 15 providing surface 12 remains solid), the nanostructures are permitted to resolidify. This process repairs geometrical defects including edge roughness and deviations from smooth curves. The guiding surface 12 can keep the adjacent nanostructure surface flat and make the sidewalls vertical. It also diminishes structural defects including crystal defects, grain boundaries and material property deterioration.

Figure 3A:
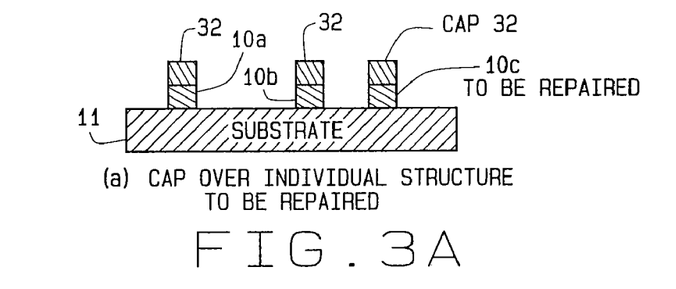
FIGS. 3a, 3b and 3c illustrate the use of guiding structures in contact with individual nanostructures.
Figure 3B:
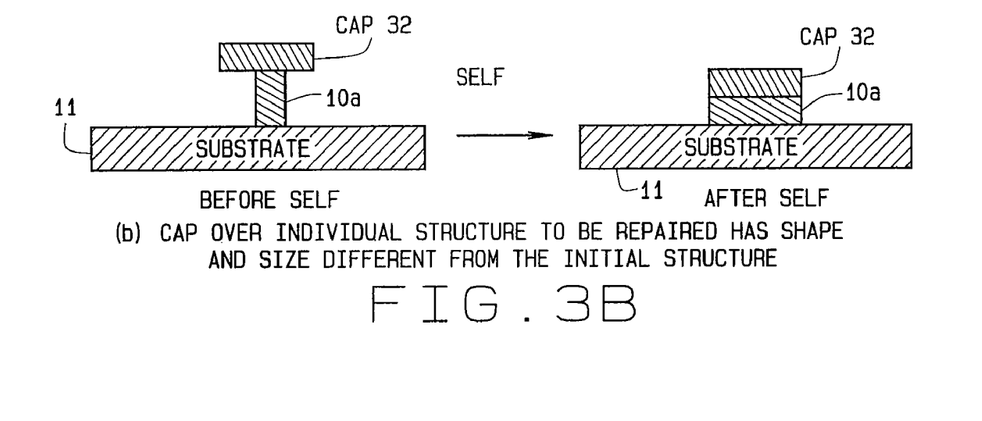
Figure 3C:
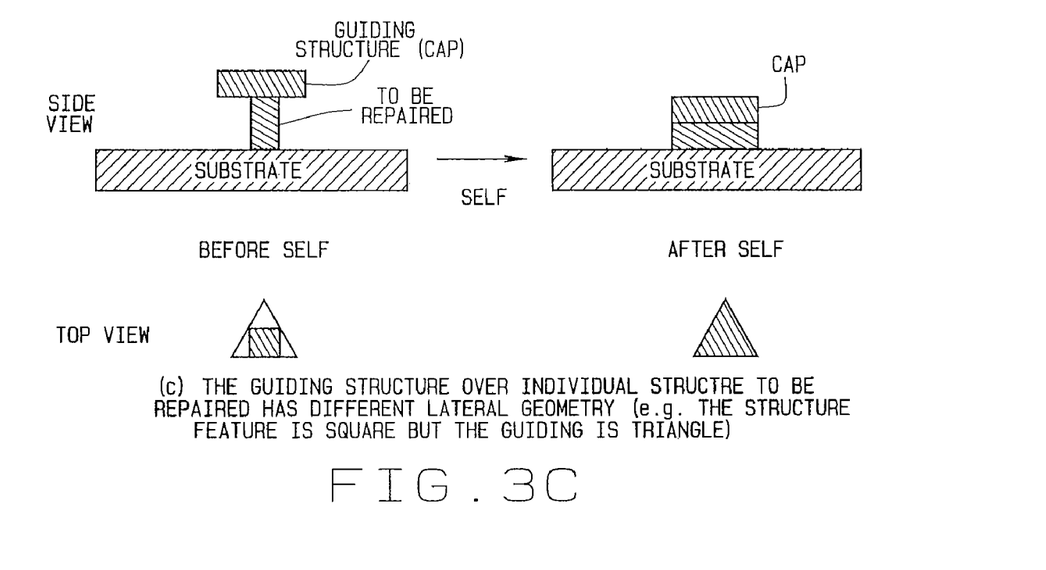

FIGS. 3a, 3b and 3c show a third embodiment of the invention wherein the guiding surfaces are in the form of individual guiding structures 32 disposed on exposed top surfaces of individual nanostructures 10a, 10b and 10c. The guiding structures are made of material having a higher melting temperature than the nanostructures. The guiding structures can have the same dimensions as the nanostructures they contact (FIG. 3a) or they can have different dimensions (FIG. 3b), or different shape (e.g. square in the device structure but triangle in the guiding structure) (FIG. 3c). The individual guiding structures can be fabricated on the top of each nanodevice structural feature or on a surface of a guiding plate. In each case, the nanostructures are heated to a molten state for a period of time while the guiding structures remain substantially solid, and then the nanostructures are permitted to resolidify. In each case, the process repairs geometrical and structural defects. The guiding structures keep the adjacent surfaces flat and help make the sidewalls vertical. As shown in FIG. 3b, if the individual guiding structure 32 is larger than its covered nanostructure 10a of FIG. 2b, the nanostructure tends to spread over the area of the guiding structure.

Figure 4A:
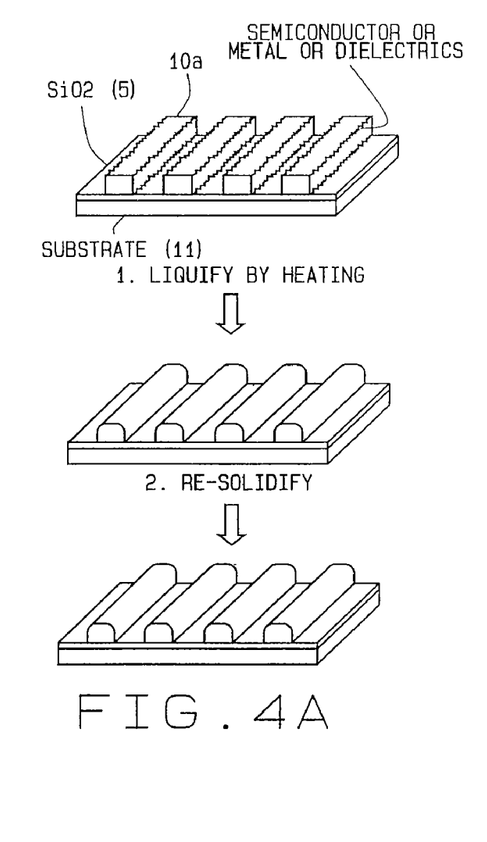
FIGS. 4a and 4b show self-repair of solid nanostructures or substrates by selective heating of the nanostructures.
Figure 4B:
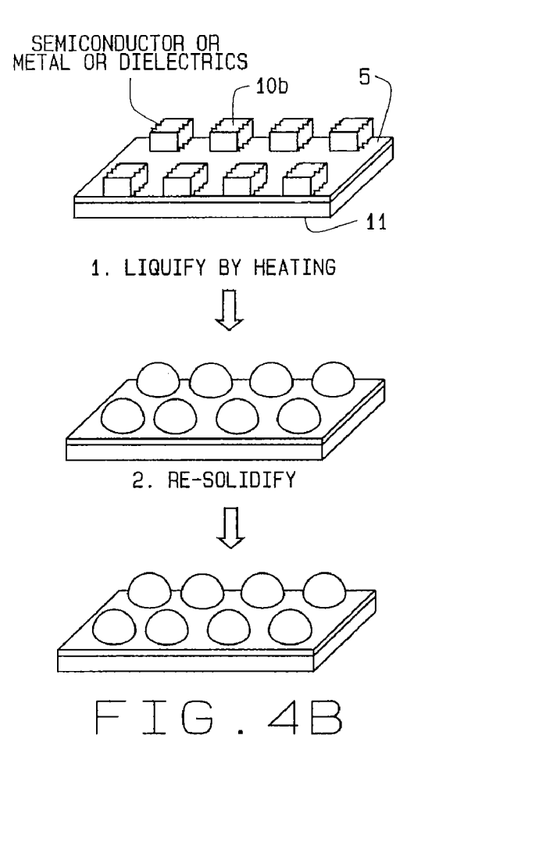

FIGS. 4a and 4b illustrate yet another embodiment wherein solid, high melting temperature nanostructures such as semiconductor, metal or dielectric nanostructures 10a, 10b are selectively heated on a substrate while keeping solid the bulk of the substrate 11 and any other intervening structures 5 between the nanostructures and the substrate. In this particular example, nanostructures 10a of FIG. 4a are intended as stripes and nanostructures 10b of FIG. 4b are intended as circular dots. The intervening layer 5 is silicon oxide on a silicon substrate 11.

After a period of time the nanostructures 10a, 10b are permitted to resolidify. The process repairs geometrical defects and structure defects. The geometrical defects include edge roughness and deviations from a smooth intended shape (e.g. convex or concave shapes deviating from a straight edge or a flat surface, or non-circular shapes of a supposedly round dots). The structural defects include crystal defects, grain boundaries and material property deterioration. The selective heating means that only the nanostructures to be repaired are heated to the molten state.

In some applications, the guiding material will be removed after the self-repair and enhancement. In other applications, the guiding material will stay on the nanodevices, becoming a functional part of the nanodevice.

While not wishing to be bound by theory, applicants' best current understanding is that the above-described self-repair by liquification ("SELF") is primarily due to (a) the surface tension of a liquid that tends to smooth out surface variation and (b) low viscosity of a liquid that allows the liquid to flow and change its shape in a very short time. The repair of structural defects in a solid material by SELF is primarily due to the highly activated movements of atoms and electrons in a liquid (molten) state of the material to be repaired.

The rising of a liquid material to a plate surface which initially has a gap above the material is due to attractive forces between the material and the plate. The forces can include electrostatic forces, van der wall forces, molecular forces, and others.

The rising of featureless molten resist films which initially featureless and flat to form periodic pillar arrays and touch the top plate were discovered by one of the inventors, Chou and Lei Zhuang, and described in U.S. Pat. No. 6,713,238. The resist materials were polymeric and the initial films were essentially featureless in the nanoscale regime. Patterns were created only by the liquification, and the microscale features that were created were determined by the parameters of the materials rather than the design of the users.

In the present case, the initial structures now can be prepatterned to the nanoscale level rather than featureless, and they can be composed of high melting temperature solids (melting temperature>400 degrees C.) rather than low melting temperature polymeric resists.

The heating of a solid material in SELF can be provided in various forms, including radiation heating, conduction heating and convection heating. The heating can come from a laser, lamp, resistor heater, radiation source, RF heater, ultrasonic heater or the like. The heating can also be indirect as by disposing a heat conducting material on top of the structures to be repaired. The heating can be pulsed or continuous. The heating time can be as short as 1 ps or as long as many seconds or even minutes depending the other requirement of the fabrication. The heating can be a single pulse or multiple sequential pulses. The heating can be controlled in such way that the desired shape of the structure will be achieved.

The heating of nanostructures can be blanket heating over an entire substrate (or a die area) or selective heating that directly heats only the intended nanostructures. The selectivity can achieved by using a mask or grating that effectively blocks out areas where heating is unwanted. The mask or grating can be disposed directly on the substrate or be positioned away from the substrate (similar to a mask used in a projection lithography). The mask can also be a lithographic mask such as that initially used to make the nanostructure. Another way of selective heating is to direct or scan a focused beam on the designated structure.

The guiding surface layer or plate 15 can be transparent to the heating source, so that the heating energy can pass through the plate without significant absorption. Exemplary materials for the layer or plate include quartz, silicon dioxide, glass and the like.

A layer or plate 15 or a guiding structure 32 should have a melting temperature higher than that of the nanostructures to be repaired. Preferably, the layer, plate or guiding structure does not absorb the heating energy or absorbs less than the nanostructure, e.g. the heating is by radiation that is selectively absorbed by the nanostructure.

The surfaces of the guiding structure adjacent to the nanostructure can be treated to have a desirable wetting or non-wetting (hydrophobic or hydrophilic) property, depending upon the final desired structure. For creating a vertical sidewall 14, a hydrophobic surface is often preferred.

Heating selectivity can be achieved by carefully selecting the wavelength of heating radiation so that only the intended nanostructure will absorb the heating radiation. For example, to selectively heat silicon or metals surrounded by $SiO_2$, a laser or heating source having a wavelength of 308 nm (XeCl) or wavelength ranging from 190 nm to 500 nm can be used. The laser will melt only the surface of the silicon or metal but not the surrounding $SiO_2$ or the materials underneath. This is because $SiO_2$ has an energy band gap larger than that of laser wavelength. Consequently the laser energy is absorbed by an ultra-thin surface layer of silicon or metal and hence does not directly penetrate into the materials beneath the thin surface. The heating radiation wavelength can be either narrow bandwidth less than 5 nm or wide bandwidth 5-1000 nm.

The selective heating and heating time can be controlled so that the defects of nanostructures are repaired while other structures on the substrate are unharmed (or not altered significantly). In some cases, ultra-fast heating or selective heating or both are required. A pulsed excimer laser or a pulsed lamp is advantages for such control.

SELF can be used to repair defects on various types of materials including semiconductors, metals, dielectrics, ceramics, polymers, semi-liquids, and combinations, mixtures or alloys of these materials. SELF is particularly advantageous for repairing nanostructures composed of these hard materials that typically have melting temperatures in excess of 400 degrees C.

The structure features of the nanostructures repaired or enhanced by the invention have the shapes of square, rectangles, circles, polygons, and other different geometries.

The structural features of the nanostructures can be formed of a material selected from the group consisting of semiconductors, metals, dielectrics, ceramics, polymers, semi-liquids, and combinations, mixtures or alloys thereof.

The guiding structures can be formed of a material selected from the group consisting of semiconductors, metals, dielectrics, ceramics, polymers, and combinations, mixtures or alloys thereof.

The substrate can be formed of a material selected from the group consisting of semiconductors, metals, dielectrics, ceramics, polymers, and combinations, mixtures or alloys thereof.

Figure 5:
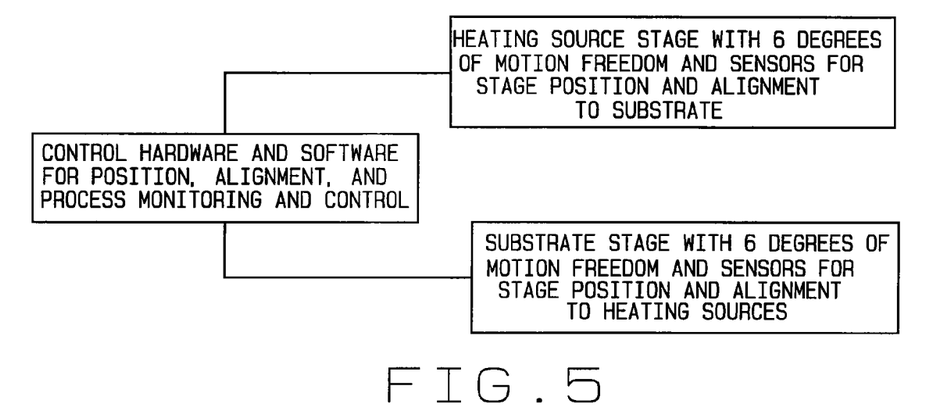
FIG. 5 schematically illustrates a tool for performing self-repair and/or structural enhancement of nanostructures.

Referring to FIG. 5, a tool that performs SELF can include stages for a substrate, for masks and for one or more heating sources. It can include mechanisms for the alignment of the substrate masks, and heating sources. It advantageously includes sensors for machine operation, machine vision to monitor machine operation, and programmed machine intelligence.

During a selective SELF process, precise alignment of the heating source and the nanostructures is advantageous. This alignment can be achieved using optical or electrical alignment techniques. For example, the alignment sensors and alignment marks may be an optical detector and optical alignment marks respectively which generate a Moire alignment pattern. Moire alignment techniques may then be employed to position the heating areas relative to the nanostructures to be repaired. Such techniques are described by Nomura et al., A MOIRE ALIGNMENT TECHNIQUE FOR MIX AND MATCH LITHOGRAPHIC SYSTEM, J. Vac. Sci. Technol. B6(l), January/February 1988, pg. 394 and by Hara et al., AN ALIGNMENT TECHNIQUE USING DEFRACTED MOIRE SIGNALS J. Vac. Sci, Technol. B7(6), November/December 1989, pg. 1977, both of which are incorporated be reference. As another example, alignment marks can be plates of a guiding structureacitor such that sensor detects the guiding structureacitance between marks. Each stage can have up to six degrees of freedom in movement: x, y, z, and three rotation degrees.

A controller can monitor all or part of operation parameters, e.g. electrical, optical, pneumatic and mechanical parameters. Control software can manage the feedback, analysis, intelligent decision making, and control.

The invention may be more clearly understood by consideration of the following examples:

EXAMPLE 1

Figure 6:
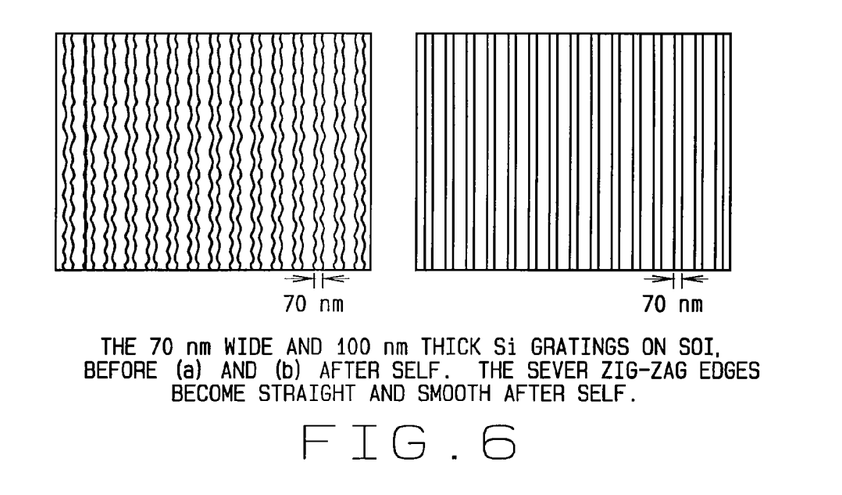
FIGS. 6 through 8 depict specific examples of nanostructures self-repaired and/or enhanced by processes of the invention.

An excimer laser of 308 nm wavelength and a pulse width 20 ns was used in a SELF experiments. Both edge roughness and non-circular shapes in Si and Cr successfully repaired. FIG. 6 shows that the severe zigzag edges on Si lines of 70 nm wide and 100 nm thick on SOI became straight and smooth after a single excimer pulse at a fluence of 545 $mJ/cm^2$.

EXAMPLE 2

Figure 7:
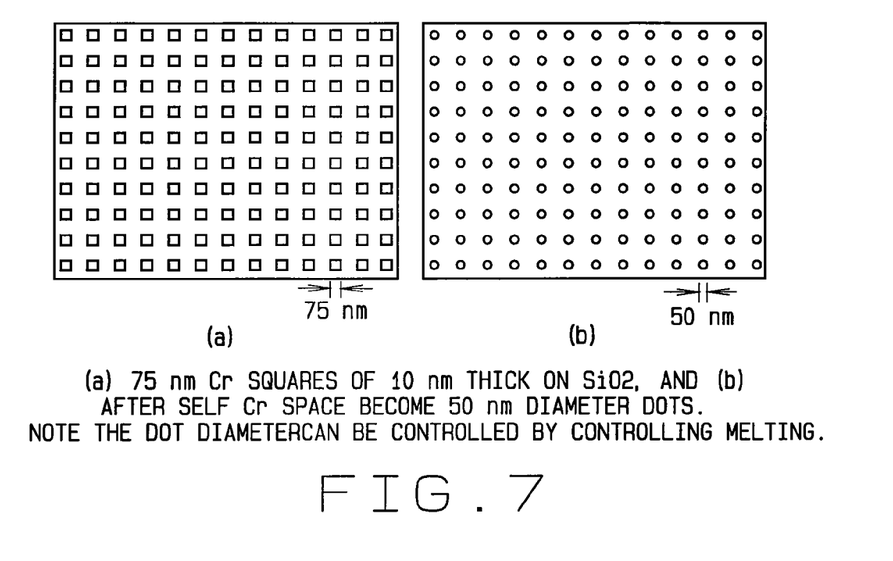

FIG. 7 shows that using SELF, non-circular Cr "dots" of 10 nm thick on $SiO_2$ with an initial shape like a square can be turned into nearly perfect circular dots.

EXAMPLE 3

Figure 8:
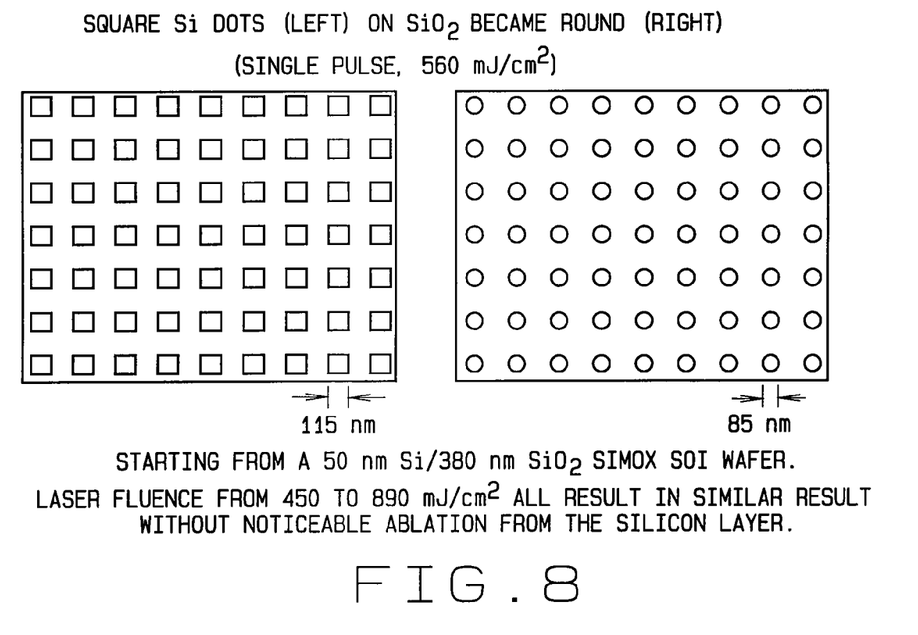

FIG. 8 shows Si squares of 115 nm side and 50 nm thickness on $SiO_2$ of a SIMOX SOI wafer before SELF. They become Si dots of 85 nm diameter after SELF. Laser fluence from 450 to 890 mJ/cm2 all result in similar result without noticeable ablation from the silicon layer.

EXAMPLE 3

Figures 10A, 10B, 10C:
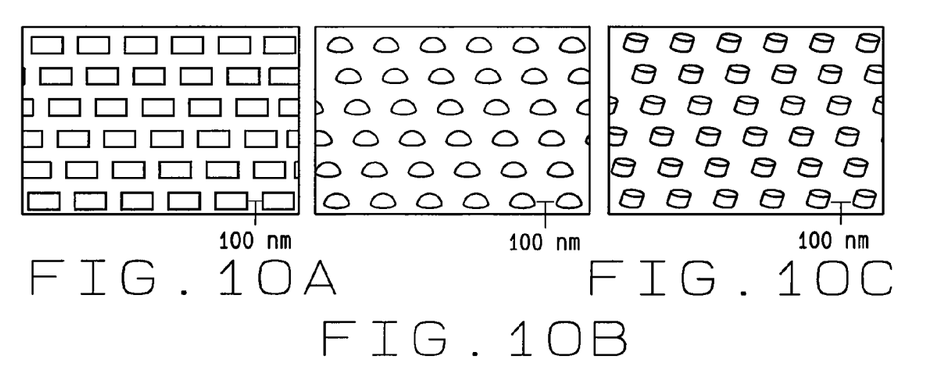

FIG. 10.a shows an SEM image of the Cr pads (nanostructure to be repaired and enhanced) deposited on a fused silica substrate with an lateral dimension of 110 nm by 140 nm and 20 nm in height. FIG. 10.b. shows an SEM image of the Cr square structure in FIG. 10.a. having become round dots of 80 nm diameter and 48 nm height, after being subjected to a single pulse (20 ns pulse width) Excimer laser (308 nm wavelength) radiation at 420 mJ/cm2 without using any guiding structure. FIG. 10.c. shows an SEM image of the Cr square structure in FIG. 10.a. having become cylindrical pillars of 62 nm height with a diameter of 70 nm, which have flat tops, vertical walls, and a much higher aspect ratio, after a single laser pulse 9308 nm (wavelength) of 420 mJ/cm2 and 20 nm pulsewidth in the presence of a guiding structure made of quartz with a flat guiding surface and an initial 60 nm gap above the initial Cr structure surface. The Cr structure rose and touched the top surface during the melting.

In the above examples, the selective heating in SELF was performed by a pulsed laser, which is absorbed by only a thin surface layer of the materials with a band gap smaller than the photon energy. The other materials on the surface or underneath will be kept at much lower temperature during SELF. Unlike the well-known edge smoothing and shape-rounding in melting a polymeric material by isothermal heating, SELF can repair the surface fabrication defects without melting or damaging other device elements or substrate.

The time for self-repair in SELF is less than 200 ns, which is five to six orders of magnitude shorter than the time to smooth out a polymeric material. Such fast repair time, which is essential to not damage other parts of a chip and applications, is attributed to the fact that in comparison with a molten polymeric material, molten semiconductors and metals have a viscosity of three to five orders of magnitude lower and a surface tension at least 10 times higher.

The self-repair and enhancement of nanostructures described here can be performed in vacuum or in a gas mixture to improve the structure features of the nanodevices. The gas mixtures can include inert gases (such as nitrogen, argon) and passivation gases (such as hydrogen, water vapor).

The methods described here can be used to make the products in many disciplines, including electronics (in particular integrated circuits), optics, optoelectronics, magnetics, data storage (both magnetic and optical), biotechnology, and the like.

The methods described here also can be used in fabrication of nanoimprint molds for different applications, including those described above.

It will be understood that we have illustrated only a few of the many possible ways the SELF repair mechanism can be used to repair nanostructures. Those skilled in the art can make many variations and modifications of the SELF process without departing from the spirit and scope of the invention.

What is claimed is:

1. A method of reducing geometrical and/or structural defects in a nanoscale device having at least one nanostructure with a minimum dimension about one micrometer or less comprising the steps of:
   providing the nanoscale device;
   placing a guiding surface adjacent an exposed surface of the nanostructure;
   liquifying the nanostructure for a period of time; and
   permitting the liquified nanostructure to resolidify.

2. The method of claim 1 wherein the guiding surface is spaced a distance from the surface of the nanostructure.

3. The method of claim 1 wherein the guiding surface is in contact with the surface of the nanostructure.

4. The method of claim 1 wherein the nanostructure is liquified by exposing the nanostructure to radiation energy.

5. The method of claim 1 wherein the nanostructure is disposed on a substrate and is liquified by flood heating the substrate.

6. The method of claim 1 wherein the nanostructure is deposed on a substrate and is liquified by selectively directed radiation to portions of the substrate where the features are disposed.

7. The method of claim 1 wherein the nanostructure is disposed on a substrate and is liquified by masking the substrate to selectively expose portions where the nanostructure is located and directing radiation through the mask.

8. The method of claim 1 wherein the nanostructure is disposed on a substrate and is liquified by scanning a beam of radiation on the substrate where the nanostructure is located.

9. The method of claim 1 wherein the nanostructure is disposed on a substrate comprising silicon.

10. The method of claim 1 wherein the nanostructure is liquified by radiation heating, condition heating, convection heating or ultrasonic heating.

11. The method of claim 1 wherein the liquifying is by heating for a period of 1 ps to 100 ms.

12. The method of claim 1 wherein the liquifying is by heating for a period of 1 s or longer.

13. The method of claim 1 wherein the liquifying is by heating with radiation of one or more wavelengths that the nanostructure selectively absorbs.

14. The method of claim 13 wherein the nanostructure comprises silicon or metal, is substantially surrounded by $SiO_2$ and is liquified by radiation of substantially 308 nanometer wavelength.

15. The method of claim 1 wherein the nanostructure and other structures are disposed on a substrate and the liquifying is by heating for a time sufficient to repair defects in the nanostructure without harming the other structures.

16. The method of claim 1 wherein the nanostructure is disposed on a substrate and a guiding cap is disposed on the nanostructure to control its shape.

17. The method of claim 16 wherein the guiding cap is composed of material that does not melt during liquifying of the nanostructure.

18. The method of claim 16 wherein the guiding cap is composed of material that wets the liquified material.

19. The method of claim 16 wherein the guiding cap is composed of material that de-wets the liquified material.

20. The method of claim 16 wherein the guiding cap is formed into a shape for shaping the nanostructure.

21. The method of claim 1 wherein the geometric defects reduced comprise one or more defects selected from the group consisting of edge roughness, surface roughness, deviation from flatness, deviation from verticality, and deviation from intended shape.

22. The method of claim 1 wherein the structural defects reduced comprise one or more defects selected from the group consisting of point defects crystal defects, grain boundaries, unwanted amorphous regions and unwanted polycrystalline regions.

23. The method of claim 1 wherein the nanostructure is formed of a material selected from the group consisting of semiconductors, metals, dielectrics ceramics, polymers, and combinations, mixtures or alloys thereof.

24. The method of claim 1 wherein the guiding surface comprises a material having a different melting temperature than that of the nanostructure.

25. The method of claim 1 wherein the guiding surface comprises a material having a melting temperature higher than that of the nanostructure.

26. The method of claim 1 wherein the guiding surface has an area at least five times greater than the exposed surface.

27. The method of claim 1 wherein the guiding surface has an area substantially the same as the exposed surface.

28. The method of claim 1 wherein the guiding surface has lateral dimensions substantially the same as those of the exposed surface.

29. The method of claim 1 wherein the guiding surface is spaced a distance from the exposed surface by spacers.

30. The method of claim 1 wherein the liquifying and resolidification of the nanostructure changes the shape of the nanostructure.

31. The method of claim 1 wherein the nanostructure has a top surface in a shape selected from the group consisting of linear strips, rectangles, circles, and polygons.

32. The method of claim 1 wherein the guiding surface has a shape selected from the group consisting of linear strips, rectangles, circles and polygons to guide the nanostructure into a similar shape on resolidification.

33. The method of claim 1 wherein the liquifiying is effected by a sequence of pulses of heating radiation.

34. The method of claim 1 wherein the liquifying is by heating radiation that is substantially completely absorbed by the nanostructure.

35. The method of claim 1 wherein the liquifying is by heating radiation with one or more wavelengths in the range 1 to 800 nanometers.

36. The method of claim 1 wherein the liquification is by heating with a monochromatic radiation source.

37. The method of claim 1 wherein the liquifying is by heating with a narrow band radiation source.

38. The method of claim 1 wherein the liquifying is by heating with a broad band radiation source.

39. The method of claim 1 wherein the liquifying is by heating radiation and the guiding surface is comprised of material that is substantially transparent to the heating radiation.

40. The method of claim 1 wherein the guiding surface is removed after the resolidification.

41. The method of claim 1 wherein the guiding surface is comprised of a material selected from the group consisting of semiconductors, metals, dielectrics, ceramics, polymers, and combinations, mixtures or alloys thereof.

42. The method of claim 1 wherein the substrate is comprised of a material selected from the group consisting of semiconductors, metals, dielectrics ceramics, polymers, and combinations, mixtures or alloys thereof.

43. The method of claim 1 wherein the nanostructure is liquified by exposure to radiation through a mask aligned to expose the nanostructure.

44. The method of claim 1 wherein the liquification and resolidification are performed substantially in vacuum.

45. The method of claim 1 wherein the liquification and resolidification are performed in a gas mixture chosen to facilitate repair or enhancement of the nanostructure.

* * * * *